(12) United States Patent
Fukazawa

(10) Patent No.: US 6,440,242 B1
(45) Date of Patent: Aug. 27, 2002

(54) METHOD OF JOINING SYNTHETIC CORUNDUM, METHOD OF MANUFACTURING SYNTHETIC CORUNDUM CELL, AND SYNTHETIC CORUNDUM CELL

(75) Inventor: Hajime Fukazawa, Kanagawa (JP)

(73) Assignees: Japan Cell, Co., Ltd., Kanagawa; Rion Co., Ltd., Tokyo, both of (JP)

( * ) Notice: Subject to any disclaimer, the term of this patent is extended or adjusted under 35 U.S.C. 154(b) by 0 days.

(21) Appl. No.: 09/422,469

(22) Filed: Oct. 21, 1999

(30) Foreign Application Priority Data

Dec. 22, 1998 (WO) .................................. PCT/JP98/5802

(51) Int. Cl.$^7$ ............................................... C03B 29/00
(52) U.S. Cl. ..................... 156/89.11; 156/153; 156/312; 428/34.6
(58) Field of Search ...................... 156/89.11, 153, 156/312; 428/34.6

(56) References Cited

U.S. PATENT DOCUMENTS

| | | | | |
|---|---|---|---|---|
| 1,588,473 A | * | 6/1926 | Kelleher | 156/89.11 |
| 5,201,977 A | * | 4/1993 | Aoshima | 156/153 |
| 6,025,060 A | * | 2/2000 | Meissner | 156/153 |

FOREIGN PATENT DOCUMENTS

| | | |
|---|---|---|
| JP | 2-124800 | 5/1990 |
| JP | 3-69600 | 3/1991 |
| JP | 3-115200 | 5/1991 |
| JP | 5-79640 | 11/1993 |
| JP | 7-145000 | 6/1995 |

* cited by examiner

*Primary Examiner*—John J. Gallagher
(74) *Attorney, Agent, or Firm*—Merchant & Gould P.C.

(57) ABSTRACT

Ground joint surfaces of two synthetic corundum pieces 4, 5 are supeposed on each other, and ends thereof are held in intimate contact with each other. The synthetic corundum pieces are then heated at a temperature equal to or lower than the melting point of synthetic corundum to joint the synthetic corundum pieces 4, 5.

12 Claims, 5 Drawing Sheets

METHOD OF JOINING SYNTHETIC CORUNDUM, METHOD OF MANUFACTURING SYNTHETIC CORUNDUM CELL, AND SYNTHETIC CORUNDUM CELL

TECHNICAL FIELD

The present invention relates to a method of joining synthetic corundum, a method of manufacturing a synthetic corundum cell using such a method of joining synthetic corundum, and a synthetic corundum cell to which such a method of manufacturing a synthetic corundum cell is applied.

BACKGROUND ART

Hexagonal synthetic corundum (synthetic sapphire) is excellent in terms of hardness, light transmission, and resistance to chemicals, and hence is used in a flow cell, for example, which is incorporated in a particle counter which count particles contained in a liquid such as hydrofluoric acid, for example.

Manufacturing products of synthetic corundum needs to join synthetic corundum pieces that have been cut to predetermined dimensions. However, since single crystals such as synthetic corundum pieces have different coefficients of thermal expansion dependent on the direction in the crystals, synthetic corundum pieces that have simply been joined together would tend to peel off, and are not suitable for use in flow cells through which the hydrofluoric acid or the like passes.

There has been known a method of manufacturing a structural body made of a single crystal of integral synthetic corundum as disclosed in Japanese patent publication No. 5-79640. According to the disclosed method, an ingot of a single crystal of synthetic corundum is cut into a first prism, and a surface of the first prism is optically ground to a flatness accuracy that is equal to or less than $\lambda/8$ of the wavelength $\lambda$ (=6328 Å) of red light, thus producing a second prism. Four surfaces, including the optically ground surface, of the second prism are surrounded by a jig, and cut into a first planar piece with a plane perpendicular to the optically ground surface. Then, both upper and lower surfaces of the first planar piece are optically ground to produce a second planar piece, which is cut into cut planar pieces. The cut planar pieces are separated and superposed by an assembling jig such that their upper and lower optically ground surfaces are aligned with each other for aligned crystalline planes, ridges, axes, and axial angles. A small pressure is applied to the planar pieces to completely eliminate any interference fringes on their transparent boundary surfaces to chemically pressurize and join the planar pieces into intimate contact with each other. The planar pieces are then heated at a temperature of 1200° C. which is lower than the melting point of 2030° C. of synthetic corundum, so that they are joined into close contact with each other.

The flatness is defined as follows: When a planar body (P) is sandwiched by two geometrically parallel planes, the flatness is expressed by the distance (f) between the two parallel planes which is minimum, and represented by a flatness X mm or X $\mu$m (X is a numerical value). Therefore, the flatness accuracy that is equal to or less than $\lambda/8$ means the flatness of at most 0.0791 $\mu$m.

According to the above method of manufacturing a structural body made of a single crystal of integral synthetic corundum, a reference surface is formed on the first prism by being optically ground to a flatness accuracy that is equal to or less than $\lambda/8$ of the wavelength $\lambda$ (=6328 Å) of red light, i.e., a flatness of at most 0.0791 $\mu$m. Then, a planar piece having the reference surface is cut from the first prism, and further cut into a plurality of planar pieces, which are combined together with respect to their reference surfaces so as to be superposed for aligned crystalline planes, ridges, axes, and axial angles. When a small pressure is applied to the planar pieces to completely eliminate any interference fringes on their transparent boundary surfaces, the planar pieces are chemically pressurized and joined in intimate contact with each other, not just held in intimate contact with each other. The planar pieces are then heated at a temperature of 1200° C. which is lower than the melting point of 2030° C. of synthetic corundum, so that they are joined into a structural body made of a single crystal of integral synthetic corundum where no boundary surfaces are present between the planar pieces and the planar pieces will not peel off.

In order to produce a synthetic corundum cell according to the above method, it is usually necessary to cut a cylindrical ingot into a prism, grind a surface of the prism to a highly small flatness of 0.0791 $\mu$m, grind planar pieces cut from the prism to a highly small flatness of 0.0791 $\mu$m, and manage a particular temperature of 1200° C. Consequently, the production process is complex, inefficient as it requires very high grinding process., and needs difficult process control. The production process is not practical, and the cost of synthetic corundum cells manufactured by the method is extremely high.

The inventor has made research efforts to develop a practical technology for joining synthetic corundum through a simple process even with a certain large value of flatness, unlike the above conventional unpractical technique. The inventor attempted to superpose synthetic corundum pieces whose ground surfaces are fully held in optical contact and heat them while adjusting the heating temperature. However, this method not only produced boundaries at the joined surfaces, but also formed smears in the boundaries, resulting in a failure to meet optical requirements. After repeating trial-and-error efforts, the inventor found that a structural body which has boundaries, but contains highly reduced smears and meet optical requirements, and are practical in terms of mechanical strength, though not firm enough to be integral, can be produced by keeping only ends of joined surfaces of synthetic corundum pieces in optical contact with each other and heating them, rather than the conventional common technical approach to superpose two optical members whose entire joint surfaces are held in optical contact with each other.

The present invention has been made in view of the problems of the conventional method of manufacturing a structural body made of a single crystal of integral synthetic corundum. It is an object of the present invention to provide a method of joining synthetic corundum which allows a synthetic corundum cell having desired optical characteristics and mechanical strength to be produced efficiently in a simple manufacturing process, a method of manufacturing a synthetic corundum cell, and a synthetic corundum cell.

SUMMARY OF THE INVENTION

To solve the above problems and achieve the above object, a method of joining synthetic corundum by joining two synthetic corundum pieces according to the present invention is characterized by the steps of super-posing ground joint surfaces of two synthetic corundum pieces, holding ends thereof in intimate contact with each other, and heating the synthetic corundum pieces at a temperature equal to or lower than the melting point of synthetic corundum to join the joint surfaces of the synthetic corundum pieces. With the above method, even if the crystalline axes, ridges, and axial angles of the synthetic corundum pieces are considerably displaced relatively to each other, the synthetic corundum pieces can be joined efficiently with sufficient optical characteristics and mechanical strength. A synthetic corundum cell can thus be manufactured in a simple production cell at a reduced cost.

The flatness of said joint surfaces should preferably in the range from ½ to ⅙ of the wavelength λ (=6328 Å) of red light, i.e., in the range from 0.3164 μm to 0.10546 μm. If the flatness of the joint surfaces were greater than λ/2 (flatness >λ/2), then no sufficient joined state may not be obtained. Demanding a flatness smaller than λ/6 (flatness <λ/6) would result in an increase in the cost and would not be practical. The temperature at which to heat the synthetic corundum pieces should preferably be in the range from 1100° C. to 1800° C. If the temperature were lower than 1100° C., then no sufficient joining strength may be obtained. If the temperature were in excess of 1800° C., then an apparatus for heating the synthetic corundum pieces would be large in size. A particularly preferable temperature range is from 1300° C. to 1500° C.

A method of manufacturing a synthetic corundum cell having a through hole therein according to the present invention is characterized by the steps of superposing ground joint surfaces of second and third synthetic corundum pieces on a ground joint surface of a first synthetic corundum piece, positioning the second and third synthetic corundum pieces in confronting relationship to each other with a predetermined spacing therebetween, holding ends of the joint surface of the first synthetic corundum piece and the joint surfaces of the second and third synthetic corundum pieces in intimate contact with each other, thereafter heating the synthetic corundum pieces at a temperature equal to or lower than the melting point of synthetic corundum to join the joint surface of the first synthetic corundum piece and the joint surfaces of the second and third synthetic corundum pieces to each other, producing a stacked assembly, superposing a ground joint surface of a fourth synthetic corundum piece on other ground joint surfaces of the second and third synthetic corundum pieces of the stacked assembly, holding ends of the other joint surfaces of the second and third synthetic corundum piece and the joint surface of the fourth synthetic corundum piece in intimate contact with each other, thereafter heating the synthetic corundum pieces at a temperature equal to or lower than the melting point of synthetic corundum to join the other joint surfaces of the second and third synthetic corundum pieces and the joint surface of the fourth synthetic corundum piece of the stacked assembly to each other, producing a synthetic corundum cell.

In the above method, the flatness of, and the temperature at which to heat, the synthetic corundum pieces are preferably the same as the flatness of, and the temperature at which to heat, the synthetic corundum pieces in the method of joining synthetic corundum.

A synthetic corundum cell having a plurality of synthetic corundum pieces whose joint surfaces are joined to each other with a groove or through hole defined thereby is characterized in that the joint surfaces of said plurality of synthetic corundum cells are ground and superposed, and ends of the synthetic corundum cells are held in intimate contact with each other, and the synthetic corundum pieces are joined by being heated at a temperature equal to or lower than the melting point of synthetic corundum.

In the specification, the term "intimate contact" represents a state in which two surfaces which are strictly analogous to each other are held in intimate contact (referred to as "optical contact") with each other without the use of an adhesive, and the term "Joining" represents holding the surfaces in a stronger intimate contact state (with higher peeling strength) than the optical contact state.

Figure 7:
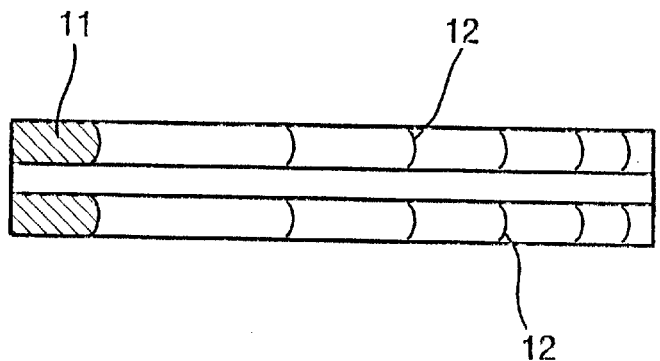
Figure 8:
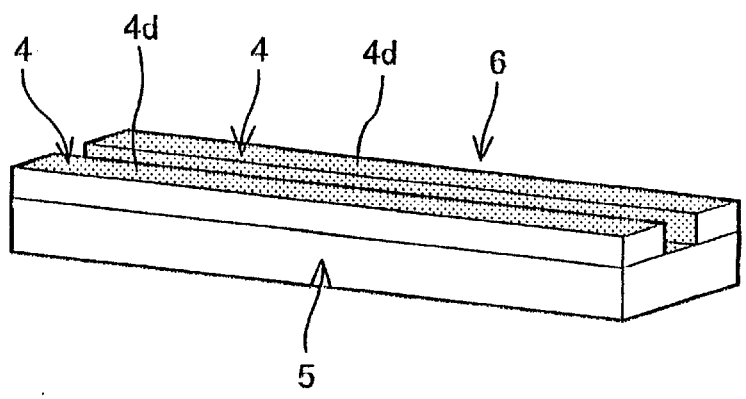
Figure 9:
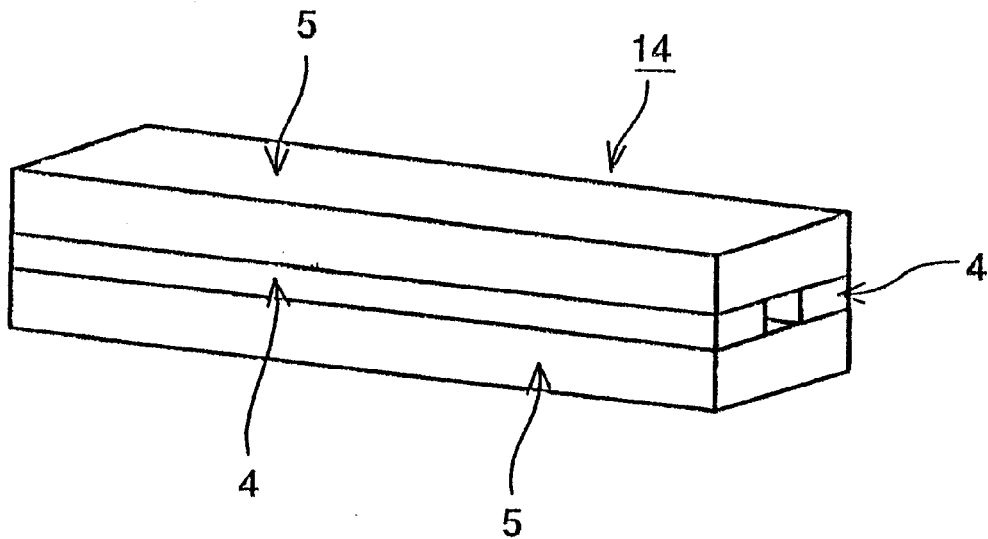
Figure 10A:
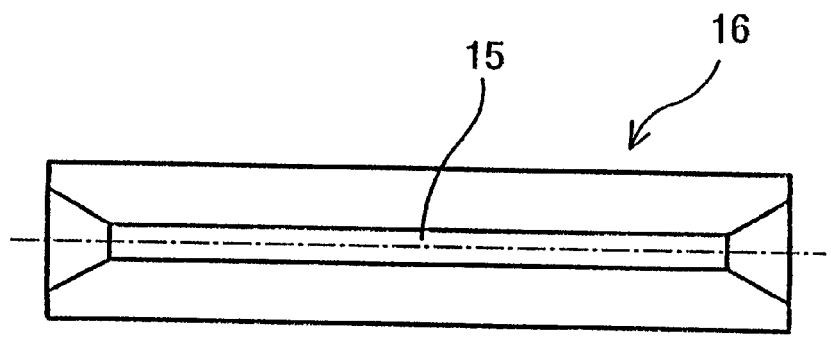
Figure 10B:
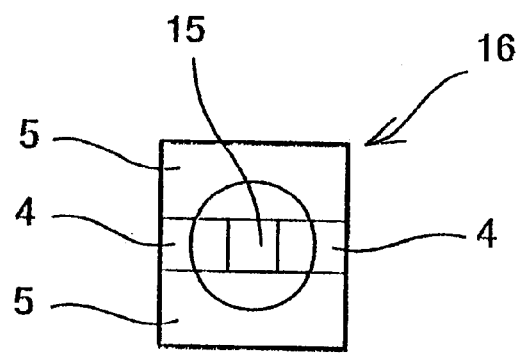

PIG. 6 is a view showing, in an exaggerated fashion, the other end of the stacked assembly whose one end is pressed;

FIG. 7 is a plan view of the stacked assembly whose one end is pressed;

FIG. 8 is a view of the stacked assembly which has been heated, with upper surfaces of the spacer plates being ground;

FIG. 9 is a view of an assembly comprising the stacked assembly shown in FIG. 8 and a light transmission plate superposed on the spacer plates of the stacked assembly; and FIG. 10(a) is a plan view of a flow cell comprising a synthetic corundum cell manufactured by a method according to the present invention, and FIG. 10(b) is a side elevational view of the flow cell.

BEST MODE FOR CARRYING OUT THE INVENTION

An embodiment of the present invention will be described below with reference to the accompanying drawings. In the embodiment, a method of joining synthetic corundum according to the present invention is applied to a method of manufacturing a flow cell which is a synthetic corundum cell according to the present invention will be described below.

Figure 1:
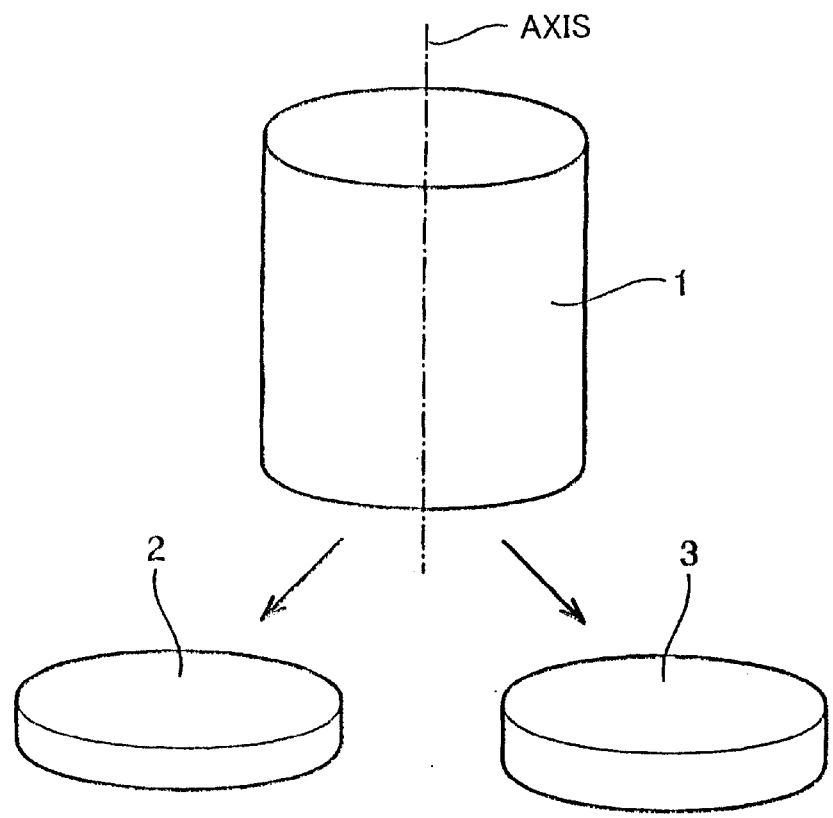
FIG. 1 is a view illustrative of the manner in which a spacer plate disk and a light transmission plate disk are cut from an ingot of synthetic corundum.

As shown in FIG. 1, a cylindrical crystalline block (ingot) 1 of synthetic corundum is cut in a direction perpendicular to the axis thereof (c-axis direction in the illustrated embodiment) to produce a spacer plate disk 2 from which one or more spacer plates for use as a second or third synthetic corundum piece will be cut, and a light transmission plate disk 3 from which one or more light transmission plates for use as a first or fourth synthetic corundum piece will be cut.

While the disk 2 is shown as being thinner than the disk 3 in FIG. 1, the thicknesses of the these disks 2, 3 may depend on the dimensions of a synthetic corundum cell to be manufactured, and are not limited to those illustrated.

Figure 2A:
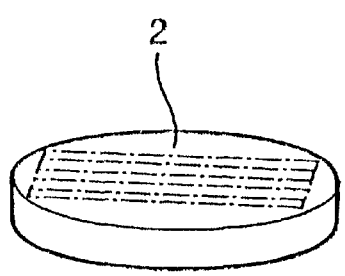
FIG. 2(a) is a view illustrative of the manner in which a spacer plate is cut from the spacer plate disk.
Figure 2A:
Figure 2B:
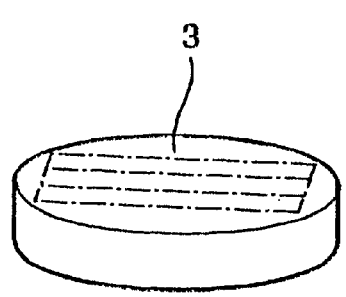
FIG. 2(b) is a view illustrative of the manner in which a light transmission plate is cut from the light transmission plate disk.
Figure 2B:

Then, as shown in FIG. 2(a), a plurality of spacer plates 4 each for use as the second or third synthetic corundum piece are cut from the spacer plate disk 2. As shown in FIG. 2(*b*), a plurality of light transmission plates 5 each for use as the first or fourth synthetic corundum piece are cut from the light transmission plate disk 3. The second and third synthetic corundum pieces comprise the spacer plates 4 of the same dimensions, and the first and fourth synthetic corundum pieces comprise the light transmission plates 5 of the same dimensions. However, they may comprise plates of different dimensions.

Figure 3A:
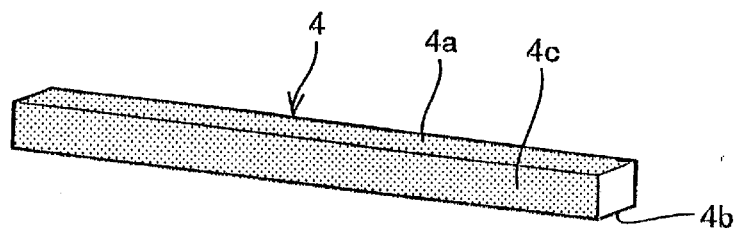
FIG. 3(a) is a view illustrative of the manner in which the spacer plate is ground.
Figure 3B:
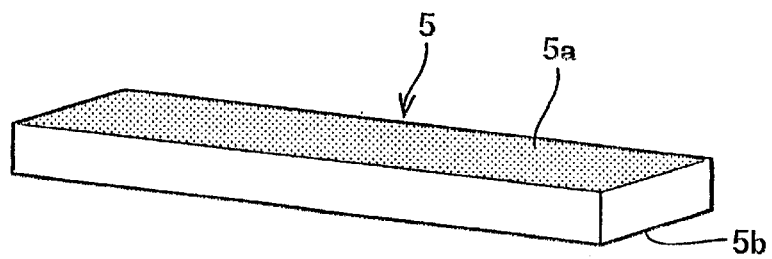
FIG. 3(b) is a view illustrative of the manner in which the light transmission plate is ground.

Thereafter, as shown in FIG. 3(*a*), upper and lower surfaces of the spacer plate 4, which will serve as joint surfaces, and a side surface thereof, which will serve as a wall surface defining a through hole of a flow cell, are ground into ground surfaces 4*a*, 4*b*, 4*c*, respectively, to a flatness of about ¼ of the wavelength $\lambda$ (=6328 Å) of red light, i.e., a flatness of about 0.1582 $\mu$m.

The flatness of the ground surfaces 4*a*, 4*b* is not limited to ¼ of the wavelength X, but should preferably be in the range from ½ to ⅙ of X, i.e., in the range from 0.3164 $\mu$m to 0.10546 $\mu$m. If the flatness of the ground surfaces 4*a*, 4*b* were greater than $\lambda/2$ (flatness $>\lambda/2$), then it would be tedious and time-consuming or impossible to mate the ground surfaces 4*a*, 4*b* with a joint surface of the light transmission plate 5 and hold their one ends in intimate contact with each other. It would be time-consuming, inefficient, and costly to grind the surfaces 4*a*, 4*b* to a flatness smaller than $\lambda/6$ (flatness $<\lambda/6$).

Although the upper and lower surfaces of the spacer plate 4 are ground into the ground surfaces 4*a*, 4*b*, the upper and lower surfaces may not necessarily be ground at this stage because an unjoined surface of the spacer plate 4 will subsequently be ground to adjust the thickness of the spacer plate 4 after the spacer plate 4 is joined to the light transmission plate 5. However, with the upper and lower surfaces of the spacer plate 4 being ground, either of the ground surfaces 4*a*, 4*b* can be superposed as a joint surface on a joint surface of the light transmission plate 5, resulting in increased working efficiency, and either of the ground surfaces 4*a*, 4*b* which better matches a joint surface of the light transmission plate 5 can selectively be used, resulting in increased joining accuracy and strength. Since the ground surface 4*c* will serve as a wall surface defining a through hole, the flatness of the ground surface 4*c* may be of such a degree as required when the final product will be used as a flow cell.

As shown in FIG. 3(*b*), upper surfaces of the light transmission plate 5, which will serve as joint surfaces, are ground into ground surfaces 5*a*, 5*b*, respectively, to a flatness of about ¼ of the wavelength $\lambda$ (=6328 Å) of red light.

While the flatness of the ground surfaces 5*a*, 5*b* is not limited to ¼ of wavelength $\lambda$ of red light, it should preferably be in the range from ½ to ⅙ of $\lambda$, i.e., in the range from 0.3164 $\mu$m to 0.10546 $\mu$m. If the flatness of the ground surfaces 5*a*, 5*b* were greater than $\lambda/2$ (flatness $>\lambda/2$), then it would be tedious and timeconsuming or impossible to mate the ground surfaces 4*a*, 4*b* of the spacer plate 4 with one of the ground surfaces 5*a*, 5*b* of the light transmission plate 5 and hold their one ends in intimate contact with each:other. It would be time-consuming, inefficient, and costly to grind the surfaces 5*a*, 5*b* to a flatness smaller than $\lambda/6$ (flatness $<\lambda/6$).

Although the upper and lower surfaces of the light transmission plate 5 are ground into the ground surfaces 5*a*, 5*b*, since only one surface thereof will be joined to the spacer 4, such a surface may be designated as a joint surface, and only the joint surface may be ground and hence both upper and lower surfaces may not necessarily be ground. If one surface is designated as a joint surface, then the flatness of a surface that is not the joint surface may be ground to such a degree as required when the final product will be used as a flow cell. However, with the upper and lower surfaces of the light transmission plate 5 being ground to the same degree, either of the ground surfaces 5*a*, 5*b* can be superposed as a joint surface on a joint surface of the spacer plate 4, resulting in increased working efficiency, and either of the ground surfaces 5*a*, 6*b* which better matches a joint surface of the spacer plate 4 can selectively be used, resulting in increased joining accuracy and strength.

A plurality of spacer plates 4 and a plurality of light transmission plates 5 may be produced in advance, and two spacer plates 4 and two light transmission plates 5 may be selected therefrom and used for increased working efficiency. Of course, two spacer plates 4 and two light transmission plates 5 may be specified and used from the grinding process on. The spacer plates 4 and the light transmission plates 5 are dimensioned such that when unground side surfaces of the spacer plates 4 are aligned with side surfaces of the light transmission plates 5, the spacer plates 4 will be spaced a predetermined distance from each other. This dimensional setting increases the working efficiency of the joining process.

Figure 4A:
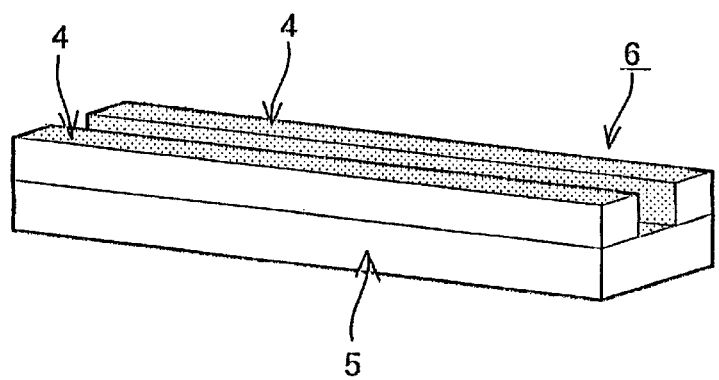
FIG. 4(a) is a perspective view of a stacked assembly comprising spacer plates set on a light transmission plate.
Figure 4B:
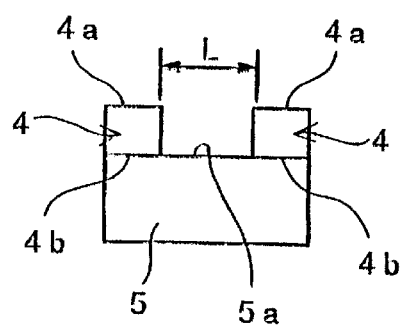
FIG. 4(b) is a side elevational view of the stacked assembly.

As shown in FIGS. 4(*a*) and 4(*b*), either of the ground surfaces 5*a*, 5*b* of an arbitrarily selected light transmission plate 5 is used as a joint surface (here, the ground surface 5*a* is used as a joint surface), and either of the ground surfaces 4*a*, 4*b* of each of two arbitrarily selected spacer plates 4 is used as a joint surface (here, the ground surface 4*b* is used as a joint surface). The light transmission plate 5 and the spacer plates 4 are superposed into a stacked assembly 6.

As described above, the spacer plates 4 and the light transmission plate 5 are dimensioned such that when unground side surfaces of the spacer plates 4 are aligned with side surfaces of the light transmission plate 5, the spacer plates 4 will be spaced a predetermined distance L from each other for increased working efficiency.

Figure 5:
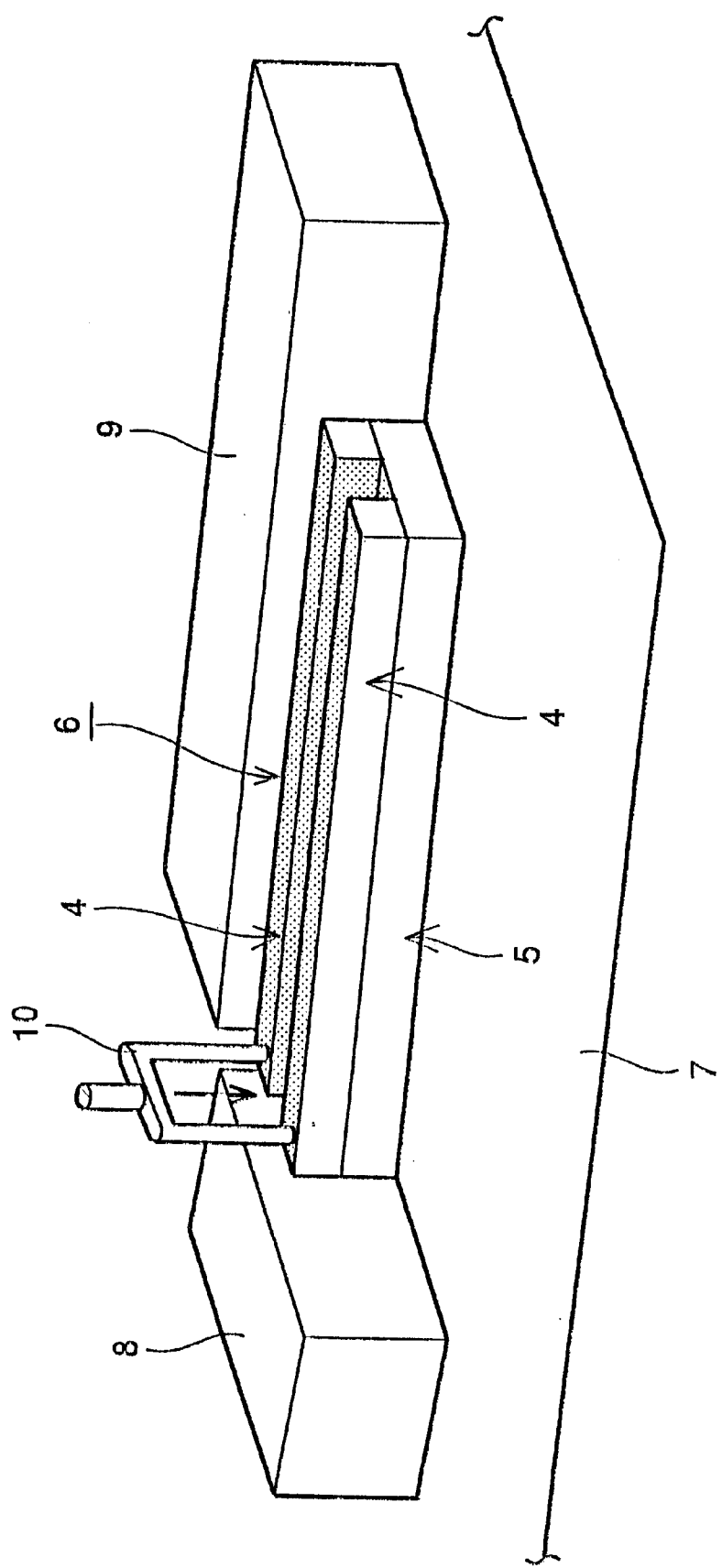
FIG. 5 is a perspective view showing the manner in which one end of the stacked assembly comprising the spacer plates set on the light transmission plate is pressed on a jig base.

The single light transmission plate 5 and the two spacer plates 4 are superposed as follows: As shown in FIG. 5, end and side surfaces of the light transmission plate 5 are aligned with respective positioning blocks 8, 9 perpendicular to each other which are placed on a jig base 7, and an end surface and an unground side surface of one spacer plate 4 are held in abutment against the respective positioning blocks 8, 9 and placed on the light transmission plate 5. Then, opposite end and side surfaces of the light transmission plate 5 are aligned with the respective positioning blocks 8, 9, and an end surface and an unground side surface of the other spacer plate 4 are held in abutment against the respective positioning blocks 8, 9 and placed on the light transmission plate 5. Ends of the spacer plates 4 are pressed by a pressing jig 10.

Figure 6:
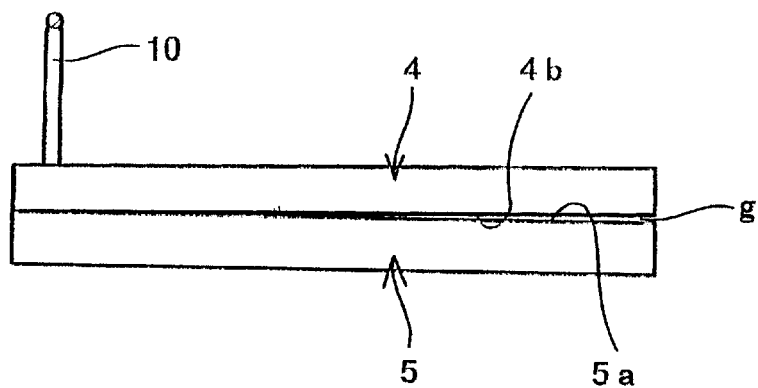

As shown in the side elevational view of FIG. 6, since lower surfaces of ends of the ground surfaces 4*b* as the joint surfaces of the spacer plates 4 and an upper surface of an end of the ground surface 5*a* as the joint surface of the light transmission plate 5 have been ground, they are held in intimate contact with each other, i.e., in optical contact with each other. A slight gap g is created between the remaining lower surfaces of the ground surfaces 4*b* of the spacer plates 4 and the remaining upper surface of the ground surface 5*a* of the light transmission plate 5. While the gap g is shown as being exaggerated for an easier understanding, it practically is difficult to visually recognize the gap g.

FIG. 7 is a plan view of the stacked assembly 6. In FIG. 7, in a region which is pressed by the pressing jig 10, the lower surfaces of the ends of the spacer plates 4 and the upper surface of the end of the light transmission plate 5 are held in an optical contact state 11, and interference fringes 12 are formed in the other region due to an air layer present between the lower surfaces of the spacer plates 4 and the upper surface of the light transmission plate 5. The interference fringes 12 appear as they are more closely spaced progressively from one end toward the other of the stacked assembly 6.

When the spacer plates 4 and the light transmission plate 5 are locally held in optical contact with each other, they are physically attracted to each other in the optical contact region, allowing the stacked assembly 6 to keep its configuration.

The stacked assembly 6 is then placed into a furnace and heated at a temperature lower than the melting point of 2030° C. of synthetic corundum, e.g., 1300° C. The ground surfaces (joint surfaces) of the spacers 4 and the ground surface (joint surface) of the light transmission plate 5 are not firmly joined to each other.

Thereafter, the stacked assembly 6 is removed from the furnace, and the ground surfaces 4a of the spacer plates 4 which are not joined are ground into ground surfaces 4d, as shown in FIG. 8, for thereby adjusting the thicknesses of the spacer plates 4. The flatness of the ground surfaces 4d is the same as the flatness of the ground surfaces 4a, 4b.

After the thickness adjustment is finished, a ground surface, i.e., a ground surface 5b in the illustrated embodiment, of another light transmission plate 5 is placed on the ground surfaces 4d of the spacer plates 4, making up a stacked assembly 14. Subsequently, an end of the light transmission plate 5 is pressed by a pressing jig 10, holding ends of the ground surfaces 4d as joint surfaces of the spacer plates 4 and an end of the ground surface 5b as a joint surface of the newly placed light transmission plate 5 in optical contact with each other, with interference fringes produced in the remaining region.

Thereafter, the stacked assembly 14 is placed into the furnace and heated, thus joining the other light transmission plate 5 to the upper surfaces of the spacer plates 4.

In this manner, there is produced a corundum cell 16 comprising two spacer plates 4 sandwiched between two light transmission plates 5 with a through hole 15 defined therebetween.

The spacer plates 4 and the light transmission plates 5 are not integrally united because of boundaries present between the spacer plates 4 and the light transmission plates 5. However, any smears on boundaries are highly reduced in the region where the joint surfaces of the spacer plates 4 and the joint surfaces of the light transmission plates 5 are not held in optical contact with each other before they are heated. Smears are produced on boundaries in the region where the joint surfaces of the spacer plates 4 and the joint surfaces of the light transmission plates 5 are held in optical contact with each other before they are heated.

It is presumed that smears on the boundaries in the region where the joint surfaces are not held in optical contact with each other are reduced because a solvent used to remove water remaining on the ground surfaces (joint surfaces) of the spacer plates 4 and the ground surfaces (joint surfaces) of the light transmission plates 5 and clean the joint surfaces is scattered away when being heated. It is presumed that smears are produced on boundaries in the region where the joint surfaces are held in optical contact with each other because a solvent used to remove water remaining on the ground surfaces (joint surfaces) of the spacer plates 4 and the ground surfaces (joint surfaces) of the light transmission plates 5 and clean the joint surfaces cannot not be scattered away from the optical contact region when being heated.

Therefore, the end of the corundum cell where smears are produced on the boundaries is removed in a subsequent process, and only a portion of the corundum cell where smears are few is used for thereby producing a corundum cell which has desired optical characteristics and sufficient mechanical strength. Inasmuch as the synthetic corundum pieces are not integrally united, they tend to peel off from the boundaries when subjected to large forces. However, the corundum cell has practically sufficient mechanical strength.

Unlike the conventional process in which a plurality of planar pieces are cut from a single piece having a surface ground to a flatness of λ/8 as a reference surface, stacked with respect to the reference surface for aligned crystalline planes, ridges, axes, and axial angles, and then heated, the synthetic corundum pieces can be joined even if crystalline axes, ridges, and axial angles are somewhat displaced out of alignment according to the present invention.

In an experiment, even if the axes were displaced about 20°, the synthetic corundum pieces could be firmly joined with substantially no optical smears. In view of the final product and the ease of the manufacturing process, it is preferable to produce the spacer plates 4 and the light transmission plates 5 such that any displacement between the crystalline axes of the synthetic corundum pieces are kept within 5°.

After the end of the corundum cell where smears are produced is removed and the corundum cell is finished to predetermined dimensions, the opposite end surfaces of the corundum cell are tapered to produce a flow cell 16 of synthetic corundum as shown in FIGS. 10(a) and 10(b).

In the above embodiment, the lower surfaces of the spacer plates 4 and the upper surface of the lower light transmission plate 5, and the upper surfaces of the spacer plates 4 and the lower surface of the upper light transmission plate 5 are heated and joined in separate processes. However, they may be heated and joined simultaneously.

In the illustrated embodiment, a method of joining synthetic corundum according to the present invention is applied to a method of manufacturing a synthetic corundum cell. However, a method of joining synthetic corundum according to the present invention is also applicable to the production of products other than synthetic corundum cells.

In a method of joining synthetic corundum according to the present invention, as described above, ground joint surfaces of two synthetic corundum pieces are superposed and then ends thereof are held in intimate contact with each other, and the synthetic corundum pieces are heated at a temperature equal to or lower than the melting point of synthetic corundum to join the joint surfaces of the synthetic corundum pieces. It is possible to manufacture a synthetic corundum cell which has desired optical characteristics and mechanical strength efficiently in a simple process.

If the flatness of the joint surfaces of the synthetic corundum pieces is in the range from ½ to ⅙ of the wavelength of red light, then the efficiency of the grinding process is increased, allowing a corundum cell to be manufactured more efficiently. If the synthetic corundum pieces are heated at a temperature range ing from 1100° C. to 1800° C., then the peeling strength of the synthetic corundum pieces is sufficient, and the temperature management is rendered easy.

In a method of manufacturing a synthetic corundum cell according to the present invention, ground joint surfaces of second and third synthetic corundum pieces are superposed on a ground joint surface of a first synthetic corundum piece, and the second and third synthetic corundum pieces are positioned in confronting relationship to each other with a predetermined spacing therebetween. Then, after ends of the joint surface of the first synthetic corundum piece and the joint surfaces of the second and third synthetic corundum pieces are held in intimate contact with each other, the synthetic corundum pieces are heated at a temperature equal to or lower than the melting point of synthetic corundum to join the joint surface of the first synthetic corundum piece and the joint surfaces of the second and third synthetic corundum pieces to each other, producing a stacked assembly. Furthermore, a ground joint surface of a fourth synthetic corundum piece is supposed on other ground joint surfaces of the second and third synthetic corundum pieces of the stacked assembly. After ends of the other joint surfaces of the second and third synthetic corundum piece and the joint surface of the fourth synthetic corundum piece are held in intimate contact with each other, the synthetic corundum pieces are heated at a temperature equal to or lower than the melting point of synthetic corundum to join the other joint surfaces of the second and third synthetic corundum pieces and the joint surface of the fourth synthetic corundum piece of the stacked assembly to each other, producing a synthetic corundum cell. In this manner a synthetic corundum cell having desired mechanical strength and optical characteristics can be manufactured efficientlyin a simple production process.

If the flatness of the joint surfaces of the synthetic corundum pieces is in the range from ½ to ⅙ of the wavelength of red light, then the efficiency of the grinding process is increased, allowing a corundum cell to be manufactured more efficiently. If the synthetic corundum pieces are heated at a temperature ranging from 1100° C. to 1800° C., then the peeling strength of the synthetic corundum pieces is sufficient, and the temperature management is rendered easy.

In a synthetic corundum cell according to the present invention, joint surfaces of a plurality of synthetic corundum cells are ground and superposed, and ends of the synthetic corundum cells are held in intimate contact with each other, and the synthetic corundum pieces are joined by being heated at a temperature equal to or lower than the melting point of synthetic corundum. It is possible to manufacture a synthetic corundum cell which has desired optical characteristics though it has boundaries, which has considerably high peeling strength though the synthetic corundum pieces may peel off from the boundaries, and which can be manufactured in a simple production process at a reduced cost and is suitable for practical applications.

I claim:

1. A method of joining synthetic corundum by joining two synthetic corundum pieces comprising the steps:
    (a) superposing ground joint surfaces of two synthetic corundum pieces;
    (b) holding ends of the joint surfaces in intimate contact with each other; and
    (c) heating the synthetic corundum pieces at a temperature equal to or lower than the melting point of synthetic corundum to join the ends of the joint surfaces of the synthetic corundum pieces wherein interference fringes form in the region between the joint surfaces of the corundum pieces other than at the ends of the joint surfaces in intimate contact.

2. The method of claim 1 wherein the flatness of the joint surfaces in the range from ½ to ⅙ of the wavelength of red light.

3. The method of claim 1 wherein the temperature is in the range from 1100° C. to 1800° C.

4. The method of claim 1 wherein there is a gap between the ground joint surfaces other than at the ends of the ground joint surfaces held in intimate contact with each other.

5. A method of manufacturing a synthetic corundum cell having a through hole therein comprising the steps:
    (a) superposing ground joint surfaces of second and third synthetic corundum pieces on a ground joint surface of a first synthetic corundum piece;
    (b) positioning the second and third synthetic corundum pieces in confronting relationship to each other with a predetermined spacing therebetween;
    (c) holding ends of the joint surface of the first synthetic corundum piece and the joint surfaces of the second and third synthetic corundum pieces in intimate contact with each other,
    (d) heating the synthetic corundum pieces at a temperature equal to or lower than the melting point of synthetic corundum to join the ends of the joint surface of the first synthetic corundum piece and the ends of the joint surfaces of the second and third synthetic corundum pieces to each other;
    (e) producing a stacked assembly, superposing a ground joint surface of a fourth synthetic corundum piece on other ground joint surfaces of the second and third synthetic corundum pieces of the stacked assembly;
    (f) holding ends of the other joint surfaces of the second and third synthetic corundum piece and the end of the joint surface of the fourth synthetic corundum piece in intimate contact with each other; and
    (g) heating the synthetic corundum pieces at a temperature equal to or lower than the melting point of synthetic corundum to join the ends of the other joint surfaces of the second and third synthetic corundum pieces and the end of the joint surface of the fourth synthetic corundum piece of the stacked assembly to each other producing a synthetic corundum cell wherein the stacked assembly forms interference fringes in the region between the joint surface of the first corundum piece and the second corundum piece and between the first corundum piece and the third corundum piece other than at the ends of the joint surfaces in intimate contact.

6. The method of manufacturing a synthetic corundum cell according to claim 5, wherein the flatness of said joint surfaces is in the range from ½ to ⅙ of the wavelength of red light.

7. The method of manufacturing a synthetic corundum cell according to claim 5 wherein said temperature is in the range from 1100° C. to 1800° C.

8. The method of claim 5 wherein there is a gap between the joint surface of the first synthetic corundum piece and the joint surfaces of the second and third synthetic corundum pieces other than at the ends of the joint surfaces of the first corundum piece and the second and third synthetic pieces in intimate contact with each other.

9. The method of claim 5 wherein there is a gap between the joint surface of the fourth synthetic corundum piece and the joint surfaces of the second and third synthetic corundum pieces other than at the ends of the joint surfaces of the fourth corundum piece and the second and third synthetic pieces in intimate contact with each other.

10. A synthetic corundum cell comprising a plurality of synthetic corundum pieces whose joint surfaces are joined to each ether defining a groove wherein the joint surfaces of said plurality of synthetic corundum pieces are ground and superposed, the ends of the joint surfaces of the synthetic corundum pieces are held in intimiate contact with each other and interference fringes form in the region between the joint surfaces of the corundum pieces other than at the ends of the joint surfaces in, intimate contact and wherein the synthetic corundum pieces are joined by being heated at a temperature equal to or lower than the melting point of synthetic corundum.

11. The synthetic corundum cell of claim 10 wherein there is a gap between the ground joint surfaces of the superposed synthetic corundum pieces other than at the ground joint surfaces in intimate contact with each other.

12. The synthetic corundum cell of claim 11 wherein interference fringes form in the region of the gap.

* * * * *